United States Patent
Kobayashi et al.

(10) Patent No.: US 9,142,575 B2
(45) Date of Patent: Sep. 22, 2015

(54) SOLID-STATE IMAGING APPARATUS AND IMAGING SYSTEM

(71) Applicant: CANON KABUSHIKI KAISHA, Tokyo (JP)

(72) Inventors: Daisuke Kobayashi, Kawaguchi (JP); Tomoya Onishi, Ayase (JP); Takeru Ohya, Machida (JP)

(73) Assignee: Canon Kabushiki Kaisha, Tokyo (JP)

(*) Notice: Subject to any disclaimer, the term of this patent is extended or adjusted under 35 U.S.C. 154(b) by 85 days.

(21) Appl. No.: 13/687,164

(22) Filed: Nov. 28, 2012

(65) Prior Publication Data

US 2013/0176470 A1 Jul. 11, 2013

(30) Foreign Application Priority Data

Jan. 6, 2012 (JP) ................ 2012-001586

(51) Int. Cl.
| | | |
|---|---|---|
| H04N 3/14 | (2006.01) | |
| H04N 5/228 | (2006.01) | |
| H01L 27/146 | (2006.01) | |
| H04N 5/335 | (2011.01) | |
| H04N 5/357 | (2011.01) | |
| H04N 5/3745 | (2011.01) | |

(52) U.S. Cl.
CPC .... *H01L 27/14601* (2013.01); *H01L 27/14609* (2013.01); *H01L 27/14658* (2013.01); *H04N 5/335* (2013.01); *H04N 5/357* (2013.01); *H04N 5/37455* (2013.01)

(58) Field of Classification Search
CPC ... H04N 5/23241; H04N 5/335; H04N 9/045; H04N 5/357; H04N 5/37455; H01L 27/14601; H01L 27/14609; H01L 27/14658
USPC ............ 348/372, 222.1, 294, 300; 257/291, 257/292; 250/208.1
See application file for complete search history.

(56) References Cited

U.S. PATENT DOCUMENTS

| | | | |
|---|---|---|---|
| 5,461,425 A * | 10/1995 | Fowler et al. | 348/294 |
| 6,452,152 B1 * | 9/2002 | Yang | 250/208.1 |
| 8,179,296 B2 * | 5/2012 | Kelly et al. | 341/155 |
| 8,189,086 B2 | 5/2012 | Hashimoto et al. | 348/300 |
| 8,692,176 B2 * | 4/2014 | Kelly et al. | 250/208.1 |
| 2010/0157083 A1 | 6/2010 | Ohya et al. | 348/222.1 |
| 2010/0259430 A1 * | 10/2010 | Okamoto et al. | 341/122 |
| 2012/0008177 A1 | 1/2012 | Fujimura et al. | |
| 2012/0305752 A1 * | 12/2012 | Shimizu et al. | 250/208.1 |

FOREIGN PATENT DOCUMENTS

| | | | | |
|---|---|---|---|---|
| JP | 2006-203736 A | 8/2006 | | |
| WO | WO 2011104787 A1 * | 9/2011 | | H04N 5/335 |

* cited by examiner

*Primary Examiner* — Nhan T Tran
(74) *Attorney, Agent, or Firm* — Fitzpatrick, Cella, Harper & Scinto

(57) ABSTRACT

A solid-state imaging apparatus having a pixel array is provided. The apparatus includes one or more ground lines and one or more power supply lines for supplying power to the pixels. Each of the pixels includes an photoelectric conversion element and an A/D converter for converting an analog signal corresponding to a charge generated by the photoelectric conversion element into a digital signal. At least one of the plurality of pixels includes at least a portion of a capacitance element having a first electrode connected to one of the one or more power supply lines, and a second electrode connected to one of the one or more ground lines.

22 Claims, 5 Drawing Sheets

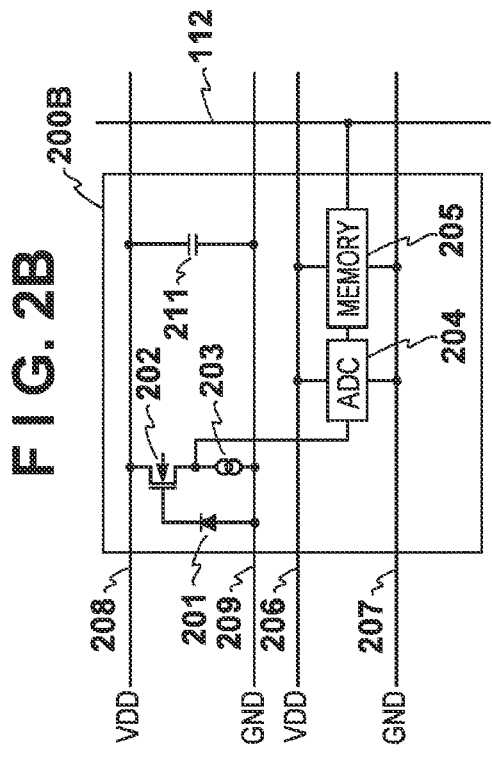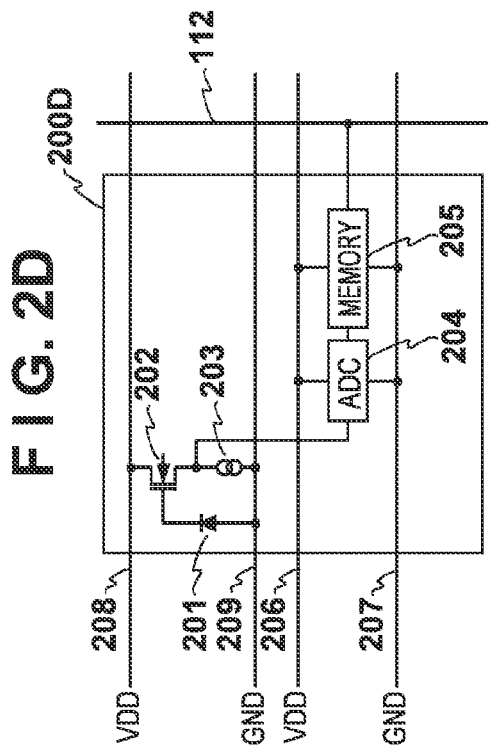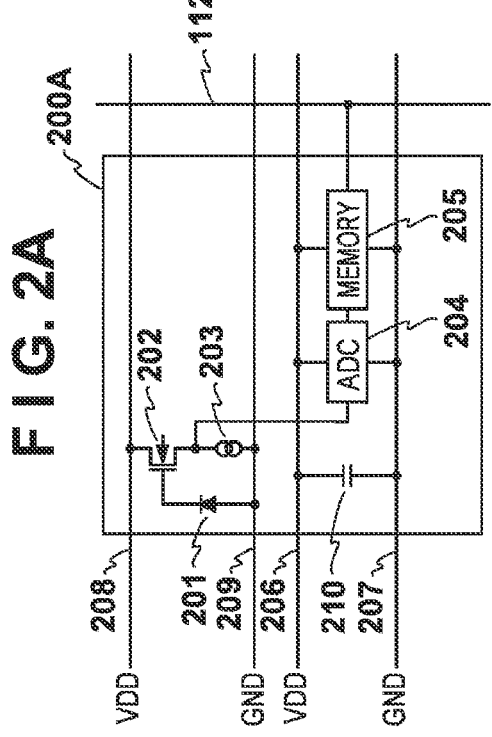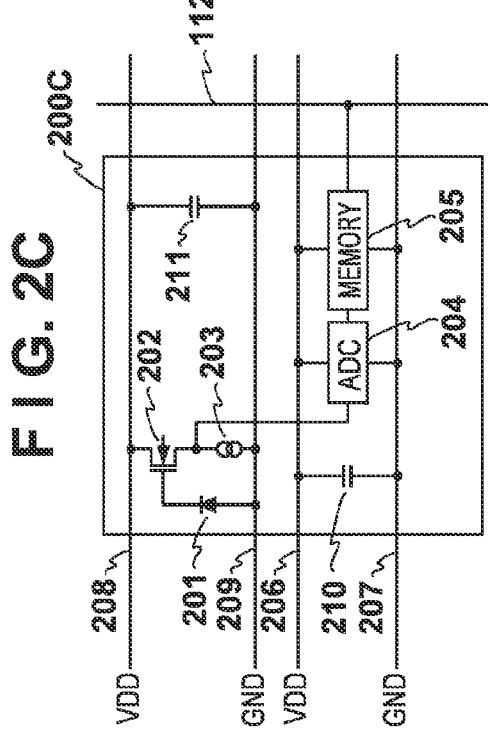

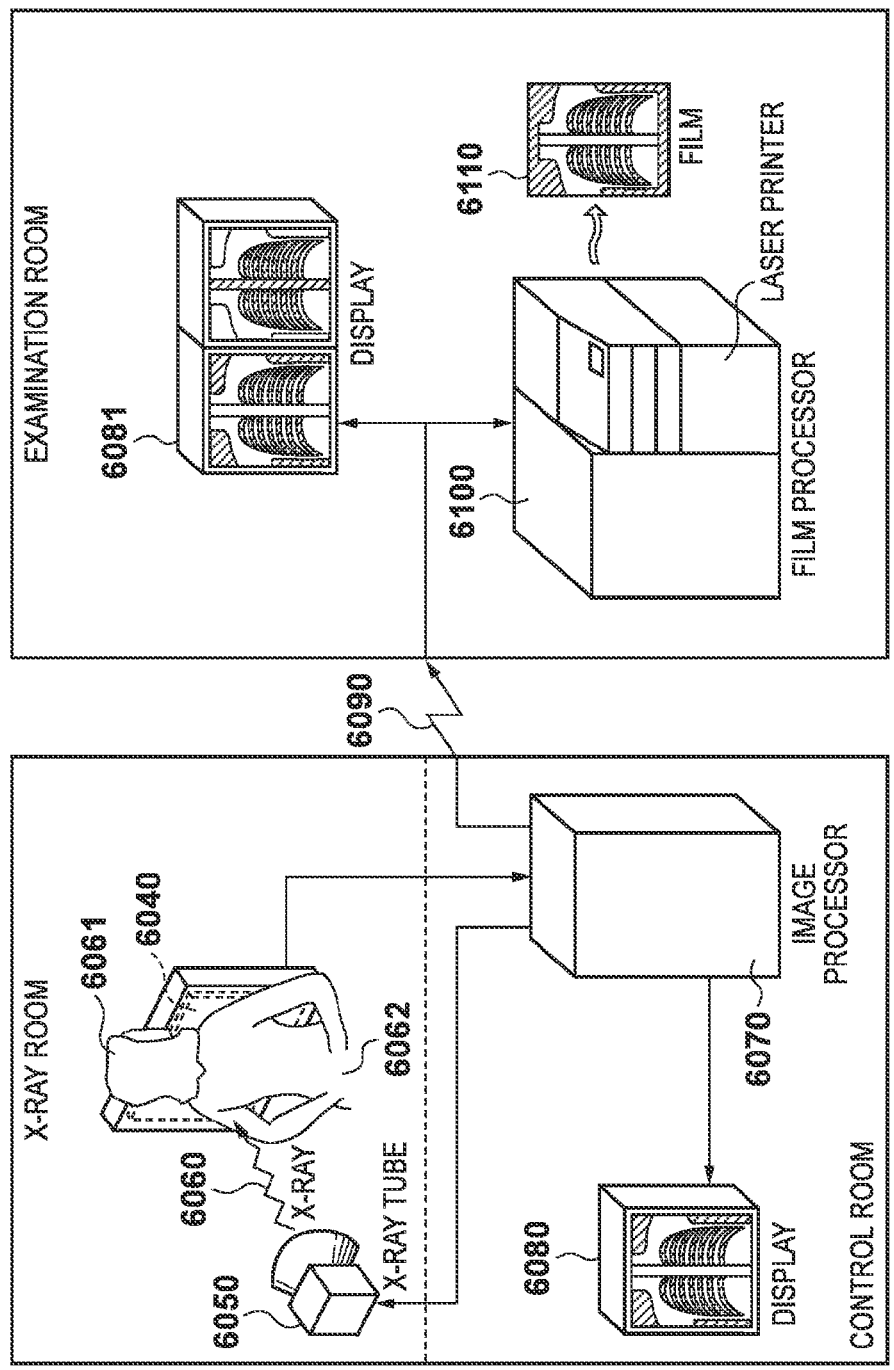

SOLID-STATE IMAGING APPARATUS AND IMAGING SYSTEM

BACKGROUND OF THE INVENTION

1. Field of the Invention

The present invention relates to a solid-state imaging apparatus and to an imaging system.

2. Description of the Related Art

Japanese Patent Laid-Open No. 2006-203736 discloses an image sensor in which each pixel has a light-receiving element and an A/D converter. With this image sensor, an analog signal obtained from the light-receiving element is output after being converted into a digital signal by the A/D converter.

SUMMARY OF THE INVENTION

With the configuration disclosed in Japanese Patent Laid-Open No. 2006-203736, the pixel circuit is susceptible to the effect of fluctuations in the ground potential and power supply potential caused by the operation of the A/D converters in the pixels, for example. When the ground potential and power supply potential fluctuate, noise is produced in the signal output from the pixel circuit, which can degrade image quality. Nor is this limited to the configuration disclosed in Japanese Patent Laid-Open No. 2006-203736, and the in-pixel readout circuit included in pixels with a large quantity of incident light can greatly change the potential of column signal lines, etc., so this can cause fluctuations in the ground potential and power supply potential. This effect extends to other pixels that share power supply lines and ground lines, and particularly surrounding pixels that share power supply lines and ground lines, and can degrade image quality. In view of this, an aspect of the present invention provides a technique that is advantageous in suppressing degradation of image quality due to fluctuations in the potential of power supply lines and ground lines.

An aspect of the present invention provides a solid-state imaging apparatus having a pixel array in which a plurality of pixels are arranged so as to constitute a plurality of rows and a plurality of columns, comprising one or more ground lines and one or more power supply lines for supplying power to the plurality of pixels, wherein each of the plurality of pixels includes an photoelectric conversion element and an A/D converter for converting an analog signal corresponding to a charge generated by the photoelectric conversion element into a digital signal, at least one of the plurality of pixels includes at least a portion of a capacitance element having a first electrode connected to one of the one or more power supply lines, and a second electrode connected to one of the one or more ground lines.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIGS. 2A to 2D illustrate an example of the pixel configuration in an embodiment of the present invention.

FIG. 5 shows an example of a radiation imaging system in an embodiment of the present invention.

DESCRIPTION OF THE EMBODIMENTS

Figure 1:
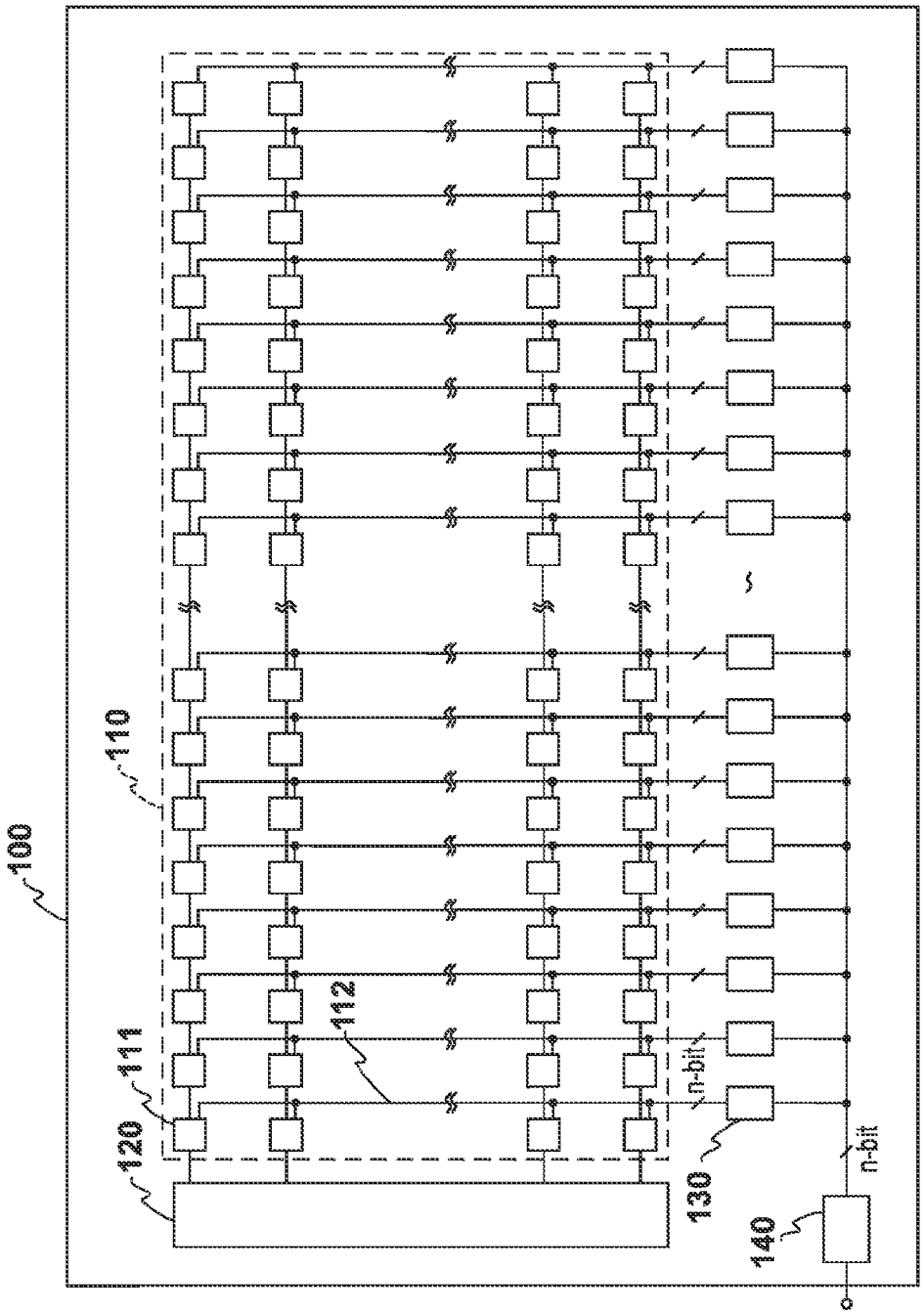
FIG. 1 illustrates an example of the configuration of the solid-state imaging apparatus in an embodiment of the present invention.

Embodiments of the present invention will now be described through reference to the appended drawings. Those elements that are the same throughout the various embodiments will be numbered the same, and redundant description will be omitted. First, an example of the configuration of a solid-state imaging apparatus 100 that is common to the various embodiments will be described through reference to FIG. 1. The overall configuration of the solid-state imaging apparatus 100 is the same as that of existing apparatuses, so an example thereof will be described only briefly below. In FIG. 1, the power supply lines and ground lines have been omitted for the sake of simplicity, and the layout of the power supply lines and ground lines will be described through reference to subsequent drawings.

The solid-state imaging apparatus 100 can include a pixel array 110, a selector circuit 120, a memory 130, and an output unit 140. A plurality of pixels 111 are arranged in the pixel array 110 so as to constitute a plurality of rows and a plurality of columns, and a column signal line 112 is arranged for every column of pixels 111. The selector circuit 120 successively scans the rows of pixels 111, and outputs n bits of digital signal from the pixels 111 included in each of the rows to the column signal lines 112. The digital signals output to the column signal lines 112 are stored in the memory 130. Then, the digital signals stored in the memory 130 are read to the output unit 140 one column at a time by scanning with a column selector circuit (not shown), and the read signals are serialized and output as LVDS signals.

An example of the specific configuration of the pixels 111 will now be described through reference to FIGS. 2A to 2D. FIG. 2A illustrates the configuration of a pixel 200A according to an embodiment. The pixel 200A can include a photoelectric conversion element 201, an MOS transistor 202, a current source 203, an A/D converter 204, and a memory 205. Power is supplied to the pixel 200A through a first power supply line 206, a first ground line 207, a second power supply line 208, and a second ground line 209. The first power supply line 206, the first ground line 207, the second power supply line 208, and the second ground line 209 are shared by a plurality of pixels 111.

The photoelectric conversion element 201 is typically a photodiode. The MOS transistor 202 functions as an in-pixel readout circuit, and outputs to the A/D converter 204 an analog signal corresponding to the charge generated by the photoelectric conversion element 201. The anode of the photoelectric conversion element 201 is connected to the second ground line 209, and the cathode of the photoelectric conversion element 201 is connected to the gate of the MOS transistor 202. One of the main electrodes of the MOS transistor 202 is connected to the second power supply line 208, and the other main electrode is connected to the second ground line 209 via the current source 203. The MOS transistor 202 and the current source 203 constitute a source follower circuit, and the MOS transistor 202 functions as an amplifying transistor that amplifies the signal read from the photoelectric conversion element 201 and outputs it to the A/D converter 204.

The A/D converter 204 converts the analog signal output from the MOS transistor 202 into n bits of digital signal and outputs it to the memory 205. The memory 205 stores this digital signal and outputs it to the column signal line 112. Power is supplied to the A/D converter 204 and the memory 205 through the first power supply line 206 and the first ground line 207. The A/D converter 204 and the memory 205 may have conventional configurations, and therefore will not be described in detail here.

The pixel 200A can further include a capacitance element 210. A first electrode of the capacitance element 210 is connected to the first power supply line 206, and a second electrode is connected to the first ground line 207. If the pixel 200A includes the A/D converter 204 and the memory 205, then operation of these circuits can alter the power supply potential and the ground potential. In that case, noise may occur in the signal output from the pixel 200A and other pixels (and particularly surrounding pixels) that share their power supply lines and ground lines with the pixel 200A. Also, with a pixel 200A having a large quantity of incident light, the MOS transistor 202 included in that pixel 200A greatly changes the potential at the input terminal of the A/D converter 204. This can alter the power supply potential and ground potential. Again in this case, noise may occur at the pixel 200A with an altered power supply potential and ground potential and at other pixels (and particularly surrounding pixels) that share their power supply lines and ground lines with this pixel 200A. If the capacitance element 210 is included in the pixel 200A, degradation of image quality by fluctuation of the power supply potential and ground potential can be suppressed. In particular, since there are large momentary fluctuations in current consumption during the operation of circuits that process digital signals, such as the A/D converter 204 or the memory 205, it is effective to arrange the capacitance element 210 between the first power supply line 206 and first ground line 207 that supply power to these circuits.

FIG. 2B illustrates the configuration of a pixel 200B according to another embodiment. The pixel 200B differs from the pixel 200A in that it includes a capacitance element 211 instead of the capacitance element 210. A first electrode of the capacitance element 211 is connected to the second power supply line 208, and a second electrode is connected to the second ground line 209. Here again, degradation of image quality by fluctuation of the power supply potential and ground potential can be suppressed. FIG. 2C illustrates the configuration of a pixel 200C according to yet another embodiment. The pixel 200C differs from the pixel 200A in that it includes the capacitance element 211 in addition to the capacitance element 210.

The capacitance element 210 may be one whose capacitance C satisfies the relation $C \times V > Cp \times \Delta V$, where V is the amount of voltage fluctuation permitted in a pixel, Cp is the parasitic load capacitance between the first power supply line 206 and the first ground line 207, and more specifically, the sum of adding the parasitic capacitance between the first power supply line 206 and the first ground line 207 to the load capacitance due to elements connected to each of these, and $\Delta V$ is the amount of momentary voltage fluctuation accompanying operation of the A/D converter 204 and the memory 205. The capacitance element 211 may also be one that satisfies the same relation as the capacitance C of the capacitance element 210.

Just one type of the above-mentioned pixels 200A, 200B, and 200C may be used as the pixels 111 of the solid-state imaging apparatus 100 described through reference to FIG. 1, or a plurality of these types may be used as the pixels 111 of the solid-state imaging apparatus 100. For instance, the pixels 200A may be used for some of the pixels 111, and the pixels 200B may be used for some other pixels 111. In the above example, power is supplied to the A/D converter 204 and the memory 205 that operate as digital circuits through the first power supply line 206 and the first ground line 207. Also, power is supplied through the second power supply line 208 and the second ground line 209 to the photoelectric conversion element 201 and the MOS transistor 202 that operate as analog circuits. However, power may be supplied to all of the circuit elements in all of the pixels through one set of power supply line and ground line. Also, a single pixel 111 may have three or more power supply lines and ground lines.

Also, all of the pixels 111 in the pixel array 110 may include a capacitance element, or some of the pixels 111 in the pixel array 110 may not include a capacitance element. For example, at least one type of the pixels 200A, 200B, and 200C may be used as the pixels 111 that include a capacitance element, and the pixel 200D shown in FIG. 2D may be used as the pixels 111 that do not include a capacitance element. The pixels 111 that include a capacitance element may be distributed periodically. For instance, the pixels 200A may be arranged at every fourth column and every fourth row, and the pixels 200D arranged at other pixels. Consequently, the aperture ratio of the solid-state imaging apparatus 100 can be increased over that when all of the pixels include a capacitance element. The sensitivity of the pixels may be adjusted if the pixels 200A and the pixels 200D have different aperture ratios. For example, the difference between aperture ratios may be adjusted by adjusting the amplification ratio of the MOS transistor 202. Also, with the layouts in FIGS. 2A to 2D, the A/D converter 204 and the memory 205 are both connected to a first power supply line and a first ground line, but they may be separated. For instance, it is conceivable that the operation of the A/D converter 204 will have less effect if the configuration is such that the memory 205 is connected to a third power supply line (not shown) and a third ground line (not shown). Furthermore, the memory 205 may be connected to the second power supply line 208 and the second ground line 209. The memory 205 operates digitally, but if the number of bits is small, fluctuation of the power supply caused by operation of the memory 205 may be smaller than that caused by the A/D converter 204. Therefore, an increase in the number of wires in each pixel can be suppressed, while the effect on power supply fluctuation caused by operation of the A/D converter 204 can be reduced.

Also, a plurality of pixels 111 may share a single A/D converter 204. Here again, each of the pixels 111 will have a A/D converter 204, and the analog signals obtained by these pixels 111 will be converted into digital data by the shared A/D converter 204. A single capacitance element may also be arranged spanning a plurality of pixels. Specifically, a single pixel may have a portion of a capacitance element, with other pixels having other portions of the capacitance element. For example, the first electrode and second electrode of a capacitance element may both be arranged spanning a plurality of pixels, or the first electrode may be arranged for one pixel and the second electrode for another pixel, or a combination of these may be used.

An example of the configuration of the capacitance element 210 will now be described through reference to FIGS. 3A and 3B. The configuration of the capacitance element 210 will be described below, but the capacitance element 211 may have the same configuration. The other circuit elements (the photoelectric conversion element 201, etc.) included in the pixels 111 may have a conventional configuration, and therefore will not be described here. The solid-state imaging apparatus 100 can be obtained, for example, by forming a semiconductor layer 300 of a first conductivity type by epitaxial growth on a semiconductor member (not shown) of a first conductivity type. The first conductivity type here is given as N type, and the second conductivity type as P type, but the first conductivity type may be P and the second conductivity type may be N. The circuit elements of the solid-state imaging apparatus 100 are isolated from each other by element isolation portions 302.

Figure 3A:
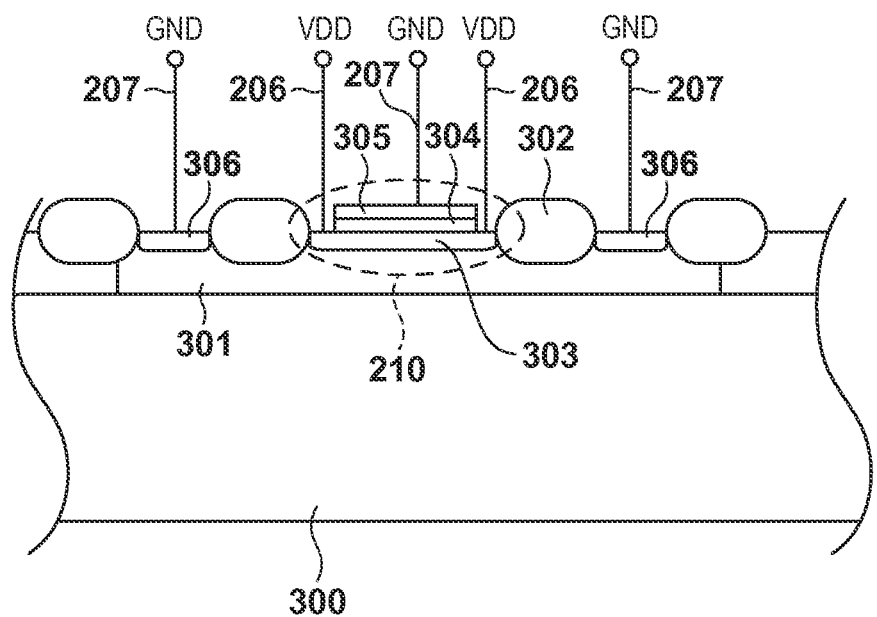
FIGS. 3A and 3B illustrate an example of the capacitance element configuration in an embodiment of the present invention.

With the configuration example shown in FIG. 3A, the capacitance element 210 can be constituted by an impurity region 303 (first electrode) connected to the first power supply line 206, a polysilicon electrode 305 (second electrode) connected to the first ground line 207, and an oxide film 304 arranged between these. The impurity region 303 of a first conductivity type can be formed in an impurity region (well) 301 of a second conductivity type formed on the semiconductor layer 300 of the first conductivity type. The oxide film 304 is formed in a gate oxide film formation step, for example, over the impurity region 303. The polysilicon electrode 305 is formed in a gate electrode formation step, for example, over the oxide film 304. The first ground line 207 may be connected to the impurity region 301 via a contact region 306. In the configuration in FIG. 3A, a metal layer may be used instead of the polysilicon electrode 305. Also, a polysilicon electrode may be used, or a metal layer may be used, instead of the impurity region 303. In this case, the polysilicon electrode or metal layer used instead of the impurity region 303 is formed over the element isolation portions 302, for example.

Figure 3B:
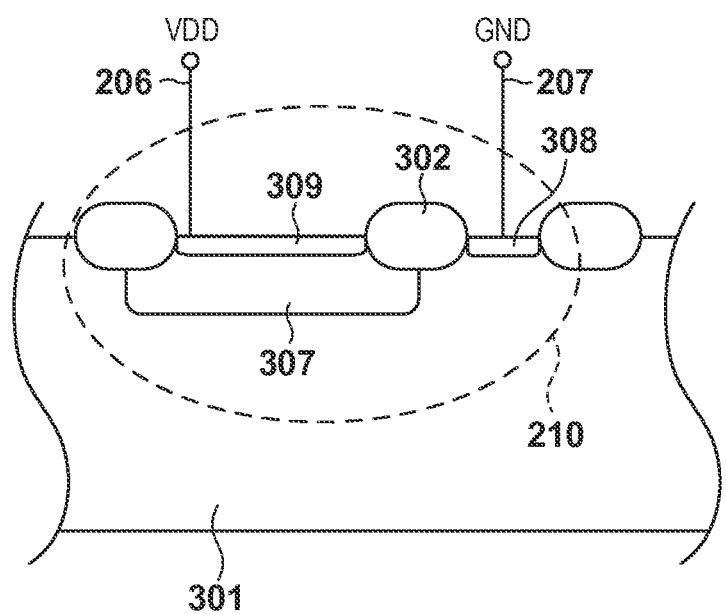

With the configuration example shown in FIG. 3B, the capacitance element 210 can be constituted by a PN junction between the impurity region (well) 301 of the second conductivity type and an impurity region 307 of the first conductivity type. The impurity region (well) 301 of the second conductivity type is connected to the first ground line 207 via a contact region 308 of the second conductivity type, and the impurity region 307 of the first conductivity type is connected to the first power supply line 206 via a contact region 309 of the first conductivity type. A reverse bias is applied to the PN junction, which causes the PN junction to function as the capacitance element 210.

Figure 4A:
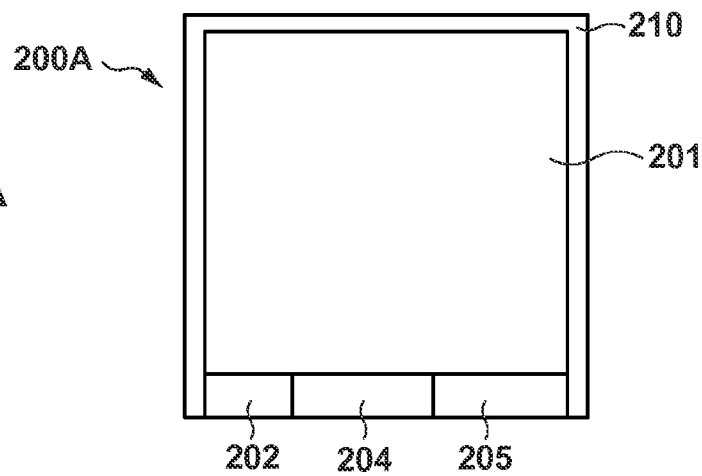
FIGS. 4A to 4C illustrate an example of the pixel layout in an embodiment of the present invention.
Figure 4B:
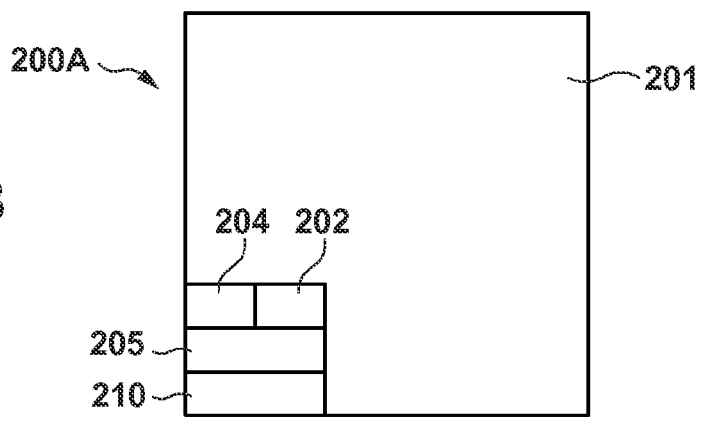
Figure 4C:
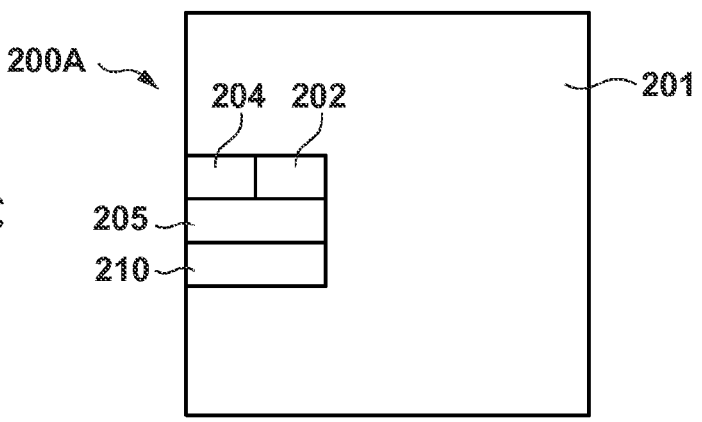

A layout example of the pixel 200A will now be described with reference to FIGS. 4A to 4C. An example of the pixel 200A will be described below, but the pixels 200B and 200C may also have the same layout. In the layout example in FIG. 4A, the capacitance element 210 is arranged so as to surround the photoelectric conversion element 201 on three sides, and the MOS transistor 202, the A/D converter 204, and the memory 205 are arranged on the remaining side of the photoelectric conversion element 201. In the layout example in FIG. 4B, the capacitance element 210, the MOS transistor 202, the A/D converter 204, and the memory 205 are arranged in the left corner of the pixel 200A. In the layout example in FIG. 4C, the capacitance element 210, the MOS transistor 202, the A/D converter 204, and the memory 205 are arranged in the approximate middle of the left side of the pixel 200A. The layout examples given here may be arranged in any orientation of the pixel array, and the symmetry between pixels can be increased by disposing all of the pixels in translational symmetry, for example. Although not illustrated in FIGS. 4A to 4C, the current source 203 may be formed within the regions for the MOS transistors 202.

In the above layout examples, all of the circuit elements of the pixel 200A were arranged on the same side of the substrate, but some of the circuit elements may be arranged on the opposite side. For example, the photoelectric conversion element 201 and the MOS transistor 202 may be arranged on a first side of the substrate, and the A/D converter 204, the memory 205, and the capacitance element 210 on the second side of the substrate. This means that the surface area of the photoelectric conversion element 201 will not be affected even though the capacitance element 210 is arranged in the pixel 200A. Also, the solid-state imaging apparatus 100 may be manufactured by forming the photoelectric conversion element 201 and the MOS transistor 202 on a first substrate, forming the A/D converter 204, the memory 205, and the capacitance element 210 on a second substrate, and then affixing the first and second substrates together. This also prevents the surface area of the photoelectric conversion element 201 from being affected by the capacitance element 210.

FIG. 5 shows an example of applying the solid-state imaging apparatus according to the present invention to an X-ray diagnostic system (radiation imaging system). This radiation imaging system comprises a radiation imaging apparatus 6040 and an image processor 6070 that processes signals output from the radiation imaging apparatus 6040. The radiation imaging apparatus 6040 constitutes the above-mentioned solid-state imaging apparatus 100 as an apparatus for capturing images of radiation. X-rays 6060 generated by an X-ray tube (radiation source) 6050 are transmitted through the chest 6062 of a patient or subject 6061, and are incident on the radiation imaging apparatus 6040. The incident X-rays include information about the internal parts of the subject 6061. The image processor (processor) 6070 processes the signals (images) output from the radiation imaging apparatus 6040, and can display an image on a control room display 6080 on the basis of the signals obtained by processing, for example.

Also, the image processor 6070 can transfer signals obtained by processing to a remote location via a transmission path 6090. This allows an image to be displayed on a display 6081 installed in an examination room at a different site, or an image to be recorded to an optical disk or other such recording medium. This recording medium may be a film 6110, in which case a film processor 6100 records images to the film 6110.

The solid-state imaging apparatus according to the present invention can also be applied to an imaging system for capturing images of visible light. Such an imaging system can comprise the solid-state imaging apparatus 100 and a processor for processing the signals output from the solid-state imaging apparatus 100, for example. The processing done by this processor can include at least one of processing to convert the format of an image, processing to compress an image, processing to change the size of an image, and processing to change the contrast of an image.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-001586, filed Jan. 6, 2012, which is hereby incorporated by reference herein in its entirety.

What is claimed is:

1. A solid-state imaging apparatus having a pixel array in which a plurality of pixels are arranged so as to constitute a plurality of rows and a plurality of columns, comprising
   one or more ground lines and one or more power supply lines for supplying power to the plurality of pixels, wherein each of the plurality of pixels includes a photoelectric conversion element and an A/D converter for converting an analog signal corresponding to a charge generated by the photoelectric conversion element into a digital signal, at least one of the plurality of pixels includes at least a portion of a capacitance element having a first electrode connected to one of the one or more power supply lines, and a second electrode connected to one of the one or more ground lines, the one or more power supply lines include a first power supply line and a second power supply line, the one or more ground lines include a first ground line and a second ground line, the A/D converters are supplied with power through the first power supply line and the first ground line, and the photoelectric conversion elements are supplied with power through the second ground line.

2. The apparatus according to claim 1, wherein the first electrode of the capacitance element is connected to the first power supply line, and the second electrode of the capacitance element is connected to the first ground line.

3. The apparatus according to claim 1, wherein the first electrode of the capacitance element is connected to the second power supply line, and the second electrode of the capacitance element is connected to the second ground line.

4. The apparatus according to claim 1, wherein
the first electrode of the capacitance element is connected to the first power supply line, and the second electrode of the capacitance element is connected to the first ground line, and
the one or more pixels further include at least a portion of a capacitance element having a first electrode connected to the second power supply line, and a second electrode connected to the second ground line.

5. The apparatus according to claim 1, wherein
the first electrode of the capacitance element is connected to the second power supply line, and the second electrode of the capacitance element is connected to the second ground line, and
the one or more pixels further include at least a portion of a capacitance element having a first electrode connected to the first power supply line, and a second electrode connected to the first ground line.

6. The apparatus according to claim 1, wherein each of the plurality of pixels further includes a memory that stores the digital signal output from the A/D converter.

7. The apparatus according to claim 6, wherein the memory is supplied with power through the first power supply line and the first ground line.

8. The apparatus according to claim 6, wherein the memory is supplied with power through the second power supply line and the second ground line.

9. The apparatus according to claim 6, wherein
the one or more power supply lines further include a third power supply line,
the one or more ground lines further include a third ground line, and
the memory is supplied with power through the third power supply line and the third ground line.

10. The apparatus according to claim 1, wherein
each of the plurality of pixels further includes an in pixel readout circuit that outputs the analog signal according to the charge generated by the photoelectric conversion element, and the in pixel readout circuit is supplied with power through the second power supply line and the second ground line.

11. An imaging system, comprising:
the solid-state imaging apparatus according to claim 1; and
a processor that processes the signal output from the solid-state imaging apparatus.

12. A solid-state imaging apparatus comprising a pixel array in which a plurality of pixels are arranged so as to constitute a plurality of rows and a plurality of columns, one or more ground lines for supplying power to the plurality of pixels, and one or more power supply lines for supplying power to the plurality of pixels,
wherein a first pixel of the plurality of pixels includes:
a first photoelectric conversion element;
a first A/D converter for converting an analog signal corresponding to a charge generated by the first photoelectric conversion element into a digital signal; and
at least a portion of a first capacitance element having a first electrode and a second electrode, the first electrode being connected to one of the one or more power supply lines, the second electrode being connected to one of the one or more ground lines,
wherein the first A/D converter is supplied with power from the one of the one or more power supply lines and the one of the one or more ground lines.

13. The apparatus according to claim 12,
wherein a second pixel of the plurality of pixels includes:
a second photoelectric conversion element;
a second A/D converter for converting an analog signal corresponding to a charge generated by the second photoelectric conversion element into a digital signal; and
at least a portion of a second capacitance element having a third electrode supplied with power through the one or more power supply lines, and a fourth electrode supplied with power through the one of the one or more ground lines.

14. The apparatus according to claim 13,
wherein the one or more power supply lines include a first power supply line and a second power supply line, and the one or more ground lines include a first ground line and a second ground line, and
wherein the first electrode is supplied with power through the first power supply line, the second electrode is supplied with power through the first ground line, the third electrode is supplied with power through the second power supply line, and the fourth electrode is supplied with power through the second ground line.

15. The apparatus according to claim 12, wherein the first pixel further includes a memory that stores the digital signal output from the first A/D converter.

16. An imaging system, comprising:
the solid-state imaging apparatus according to claim 12; and
a processor that processes the signal output from the solid-state imaging apparatus.

17. The apparatus according to claim 12, wherein the first capacitance element includes a PN junction configured to have a capacitance when a reverse bias is supplied to the PN junction.

18. The apparatus according to claim 12, wherein one of the first electrode and the second electrode is an impurity region and the other of the first electrode and the second electrode is a polysilicon electrode.

19. The apparatus according to claim 12, wherein each of the first electrode and the second electrode is a polysilicon electrode.

20. A solid-state imaging apparatus comprising a pixel array in which a plurality of pixels are arranged so as to constitute a plurality of rows and a plurality of columns, one or more ground lines for supplying power to the plurality of pixels, and one or more power supply lines for supplying power to the plurality of pixels,
- wherein a first pixel of the plurality of pixels includes:
- a first photoelectric conversion element;
- a first A/D converter for converting an analog signal corresponding to a charge generated by the first photoelectric conversion element into a digital signal; and
- at least a portion of a first capacitance element having a first electrode supplied with power through the one or more power supply lines and a second electrode supplied with power through the one of the one or more ground lines,
- wherein the first pixel further includes an in-pixel readout circuit that outputs the analog signal according to the charge generated by the first photoelectric conversion element,
- wherein the one or more power supply lines include a first power supply line and a second power supply line, and the one or more ground lines include a first ground line and a second ground line, and
- wherein the first A/D converter is supplied with power through the first power supply line and the first ground line, and the in-pixel readout circuit is supplied with power through the second power supply line and the second ground line.

21. The apparatus according to claim 20, wherein the memory is supplied with power through the one or more power supply lines and the one or more ground lines.

22. A solid-state imaging apparatus comprising a pixel array in which a plurality of pixels are arranged so as to constitute a plurality of rows and a plurality of columns, one or more ground lines for supplying power to the plurality of pixels, and one or more power supply lines for supplying power to the plurality of pixels,
- wherein a first pixel of the plurality of pixels includes:
- a first photoelectric conversion element;
- a first A/D converter for converting an analog signal corresponding to a charge generated by the first photoelectric conversion element into a digital signal; and
- at least a portion of a first capacitance element having a first electrode supplied with power through the one or more power supply lines and a second electrode supplied with power through the one of the one or more ground lines,
- wherein the first pixel further includes an in-pixel readout circuit that outputs the analog signal according to the charge generated by the first photoelectric conversion element,
- wherein the first pixel further includes a memory that stores the digital signal output from the first A/D converter,
- wherein the one or more power supply lines include a first power supply line, a second power supply line, and a third power supply line,
- wherein the one or more ground lines include a first ground line, a second ground line, and a third ground line, and
- wherein the first A/D converter is supplied with power through the first power supply line and the first ground line, the in-pixel readout circuit is supplied with power through the second power supply line and the second ground line, and the memory is supplied with power through the third power supply line and the third ground line.

* * * * *